(12) United States Patent
Stolbunov et al.

(10) Patent No.: US 12,424,827 B2
(45) Date of Patent: Sep. 23, 2025

(54) COMPACT CONTACTOR MODULE FOR INSTALLATION IN A POWER POST

(71) Applicant: GoMarina AS, Trondheim (NO)

(72) Inventors: Anton Stolbunov, Saupstad (NO); Andre Hansen, Hell (NO); Christian Aune Thomassen, Trondheim (NO); Trond Nordby, Jakobsli (NO); Davor Babic, Tiller (NO)

(73) Assignee: GoMarina AS, Trondheim (NO)

( * ) Notice: Subject to any disclaimer, the term of this patent is extended or adjusted under 35 U.S.C. 154(b) by 209 days.

(21) Appl. No.: 18/261,922

(22) PCT Filed: Jan. 20, 2022

(86) PCT No.: PCT/NO2022/050016
§ 371 (c)(1),
(2) Date: Jul. 18, 2023

(87) PCT Pub. No.: WO2022/158982
PCT Pub. Date: Jul. 28, 2022

(65) Prior Publication Data
US 2024/0079858 A1   Mar. 7, 2024

(30) Foreign Application Priority Data
Jan. 20, 2021   (NO) .................................... 20210067

(51) Int. Cl.
*H02B 1/052* (2006.01)
*H02B 1/06* (2006.01)
(Continued)

(52) U.S. Cl.
CPC ............... *H02B 1/052* (2013.01); *H02B 1/06* (2013.01); *H05K 7/1427* (2013.01); *H02B 1/03* (2013.01)

(58) Field of Classification Search
CPC . H02B 1/03; H02B 1/052; H02B 1/06; H05K 7/1427
See application file for complete search history.

(56) References Cited

U.S. PATENT DOCUMENTS

| | | | |
|---|---|---|---|
| 6,844,716 B1 | 1/2005 | Lundberg et al. | |
| 7,196,434 B2 * | 3/2007 | Zhou | H01H 9/563 335/7 |

(Continued)

FOREIGN PATENT DOCUMENTS

| | | |
|---|---|---|
| CA | 3130743 A1 | 10/2020 |
| CN | 211280668 U | 8/2018 |

(Continued)

OTHER PUBLICATIONS

Norwegian Industrial Property Office, Search Report issued Jul. 8, 2021, for corresponding Norwegian Patent Application No. 20210067.

(Continued)

*Primary Examiner* — Robert J Hoffberg
(74) *Attorney, Agent, or Firm* — Duane Morris LLP

(57) ABSTRACT

The invention relates to a compact contactor module (2) for installation in a power post (4). The contactor module (2) comprises a first region (6) associated with a first section (6a) of a printed circuit board (30) said first region (6) comprising control circuitry (8). A power converter (13) provides power to the contactor module (2). A second region (10) is associated with a second section (10a) of the printed circuit board (30). The second region (10) is galvanically isolated from said first region and comprises a 2-pole contactor (12) and an energy meter (16) associated with said contactor (12). A digital isolator (18) transfers signals between the first (6) and the second (10) regions. The printed circuit board is sandwiched between two electromagnetic shield layers (32, 34) made in a conducting material. An (Continued)

enclosure (20) fully encloses above-cited components of said contactor module (2).

11 Claims, 3 Drawing Sheets

(51) Int. Cl.
  *H05K 7/14* (2006.01)
  *H02B 1/03* (2006.01)

(56) References Cited

U.S. PATENT DOCUMENTS

| | | | |
|---|---|---|---|
| 8,134,817 B2* | 3/2012 | Carpenter | H05K 1/026 363/52 |
| 2007/0158171 A1 | 7/2007 | DeBoer et al. | |
| 2008/0304212 A1 | 12/2008 | Seff et al. | |
| 2010/0296230 A1 | 11/2010 | Storck et al. | |
| 2012/0104846 A1 | 5/2012 | Hurst et al. | |
| 2014/0292243 A1 | 10/2014 | Bouchez et al. | |
| 2020/0259336 A1 | 8/2020 | Rao et al. | |
| 2020/0292628 A1 | 9/2020 | Weeks et al. | |
| 2022/0045520 A1 | 2/2022 | Yoo | |

FOREIGN PATENT DOCUMENTS

| | | | |
|---|---|---|---|
| DE | 102023122730 A1 * | 8/2024 | ............ B60L 58/21 |
| EP | 3 496 254 | 12/2017 | |
| EP | 3496254 A1 | 6/2019 | |
| KR | 20200100967 A | 8/2020 | |

OTHER PUBLICATIONS

International Search Report and Written Opinion issued in connection with International Patent Application No. PCT/NO2022/050016, Mar. 31, 2022, 10 pages.

Extended European Search Report, Dec. 4, 2024, 11 pages.

Texas Instruments, ISOW784x High-Performance, 5000-VRMS Reinforced Quad-Channel Digital Isolators with Integrated High-Efficiency, Low-Emissions DC-DC Converter, Revised Aug. 2021, 56 pages.

* cited by examiner

COMPACT CONTACTOR MODULE FOR INSTALLATION IN A POWER POST

PRIORITY CLAIM AND CROSS-REFERENCE

The present application is a National Stage Application, filed under 35 U.S.C. 371, of International Patent Application No. PCT/NO2022/050016, filed on Jan. 20, 2022, which claims the priority of Norwegian Patent Application 20210067, filed Jan. 20, 2021, each of which is incorporated herein by reference in its entirety.

FILED OF THE INVENTION

On a general level, the invention concerns a compact contactor module for installation in a power post located in a marina or at a camp site.

BACKGROUND OF THE INVENTION

US2008/0304212 discloses a utility distribution post for marine and recreational vehicles. These utility posts include power outlets for receiving a hook-up cable of the marine or recreational vehicle. Once the hook-up cable is inserted in the power outlet and the power outlet is in the active state, the electric energy storage device of the vehicle may be replenished.

US 2020/0259336 discloses an electrical panel with branch relays where a circuit breaker is engaged with each respective branch relay.

EP 3496254 discloses a control arrangement for a power conversion apparatus, said control arrangement comprising a first section operating at a non-intrinsically-safe voltage potentials, a second section operating at intrinsically-safe voltage potentials, a galvanic barrier to electrically insulate said first and second sections one from another.

In situations where one needs to limit the access to electricity, utility posts are being equipped with contactor units. As is well-known in the art, a contactor is an electrically-controlled switch for opening/closing of a power circuit. More specifically, the current flowing through the contactor energizes a coil such that a magnetic field is created. This causes a core of the contactor to move forward whereby the electric circuit becomes closed. Once the coil is deenergized, the core moves backward and the circuit becomes open. For the power outlet to be in the active state, and be able to supply power, the contactor needs to be in an on-state, i.e. the contactor electric circuit needs to be closed.

When overhauling the power infrastructure in a marina or at a camping site, it is desirable to reuse as much of the existing equipment as possible. For instance, the utility post itself is normally not exchanged whereas the components in its interior may be replaced, for instance in consequence of prohibitive wear or in order to comply with new regulations.

Some extra elements required for building a controlled utility post, in addition to conventional contactors, are a programmable logic controller and a relay module for energizing contactors' coils, an interface to a payment system, and a power supply for those. Optionally, dedicated energy meters having a digital communication with the payment system can be installed. Moreover, extensive wiring between above-cited elements is usually required. In connection herewith, a standard utility post, to be found in marinas and/or at camping sites, is of limited size. Consequently and in the context of power infrastructure overhaul, the interior elements of the standard utility post are difficult to access. Analogously, retrofitting such a post with novel, equisized elements is ridden with considerable difficulties.

On the above background, one objective of the invention at hand is to at least alleviate drawbacks associated with the current art. More specifically, an objective of the invention is to provide a contactor unit better suited for retrofitting purposes.

SUMMARY OF THE INVENTION

The above stated objective is achieved by means of a contactor module for installation in a power post. The contactor module comprises a first, optionally grounded, region associated with a first section of a printed circuit board and comprising a power converter, communication and control circuitry for energizing relay coils, and at least one second region associated with a second section of the printed circuit board. The at least one second region is galvanically isolated from said first region and comprises the operating contact side of a 2-pole contactor mounted on said second section of the printed circuit board, and an energy meter associated with said 2-pole contactor and mounted on said second section of the printed circuit board. A digital isolator for transferring signals between the first and the second regions is mounted across the isolation barrier between the said first and second sections of the printed circuit board. The printed circuit board is sandwiched between two grounded or electrically floating layers made in a conducting material. The contactor module also comprises an enclosure that fully encloses said contactor module. Particular embodiments of said contactor module are defined in the dependent claims.

By virtue of the present invention, the size of the contactor module is vastly reduced with respect to the control modules belonging to state of the art—size reduction is well above 50%. In particular, use of a multi-channel digital isolator with power transfer function instead of traditional optocouplers/optoisolators and an isolated power converter significantly reduces the overall size. In a related context, non-desirable electromagnetic waves created by the digital isolator in operation are at least attenuated by sandwiching the entire printed circuit board between two thin layers made in a conducting material. Hereby, a compact solution is obtained. As a further benefit, a dedicated programmable logic controller or a relay module is not required because contactor coils are energized by the circuit inside the contactor module. External energy meters are not required either because metering is implemented in the contactor module.

Moreover and as all components are mounted inside the enclosure of the contactor module, preferably on a single printed circuit board, or internally wired to said board, the proposed solution keeps installation wiring at a minimum.

As explained above, a limited volume is typically available in the interior of the conventional power post. Hence, the proposed, size-reduced contactor solution with minimum wiring is particularly suitable for retrofitting existing power posts when adding or upgrading control and/or metering functionality.

All of the above entails that installation costs may also be reduced as the product to be installed is diminished and simplified while wiring is kept at a minimum.

BRIEF DESCRIPTION OF THE DRAWINGS

The objects, advantages and features of the invention will appear more clearly in the following description made with reference to the non-limiting embodiments, illustrated by the drawing, in which.

DETAILED DESCRIPTION OF THE PREFERRED EMBODIMENTS

Figure 1:
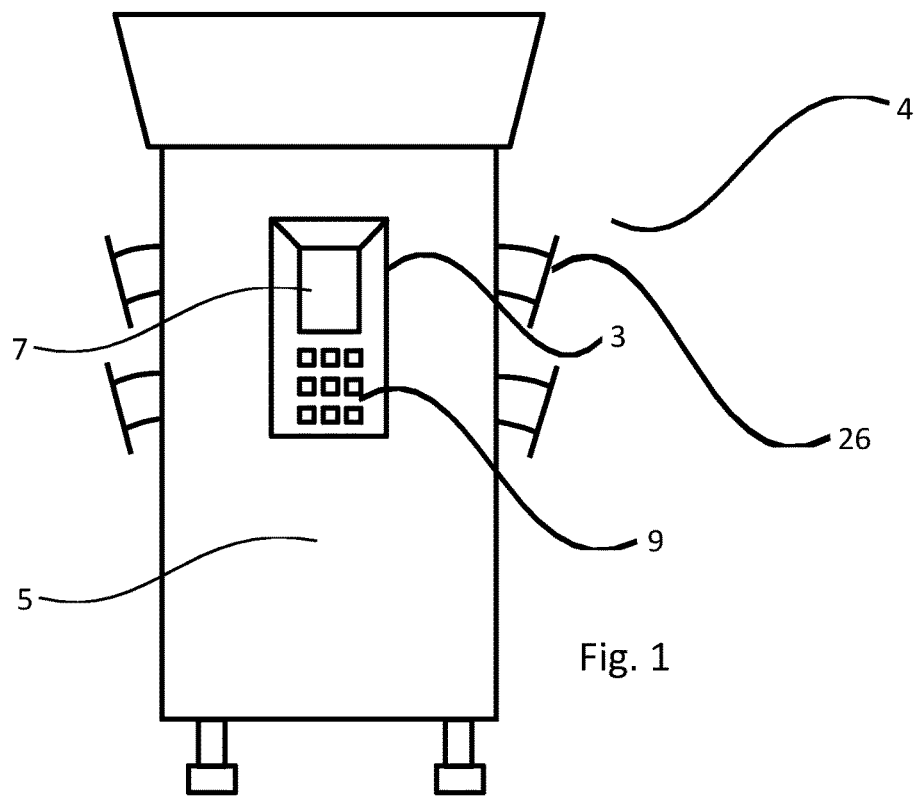
FIG. 1 is a perspective view of a power post in accordance with one embodiment of the present invention.

The present invention will now be described more fully hereinafter with reference to the accompanying drawings, in which preferred embodiments are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like reference signs refer to like elements.

FIG. 1 is a perspective view of a power post 4 in accordance with one embodiment of the present invention. These power posts 4 are frequently found in marinas and camping sites. They represent a convenient interface for boat/camper owners to purchase and access electrical energy made available by the marina or the camping site. Normally, a plurality of power outlets 26, typically four outlets, for receiving a vehicle's hook-up cable is arranged in the front panel 5 of the power post 4. The front panel 5 of the power post 4 further includes a user interface 3, typically comprising a screen 7 and a keypad 9. A contactor module (not shown in FIG. 1) is located in the interior of said power post.

Figure 2A:
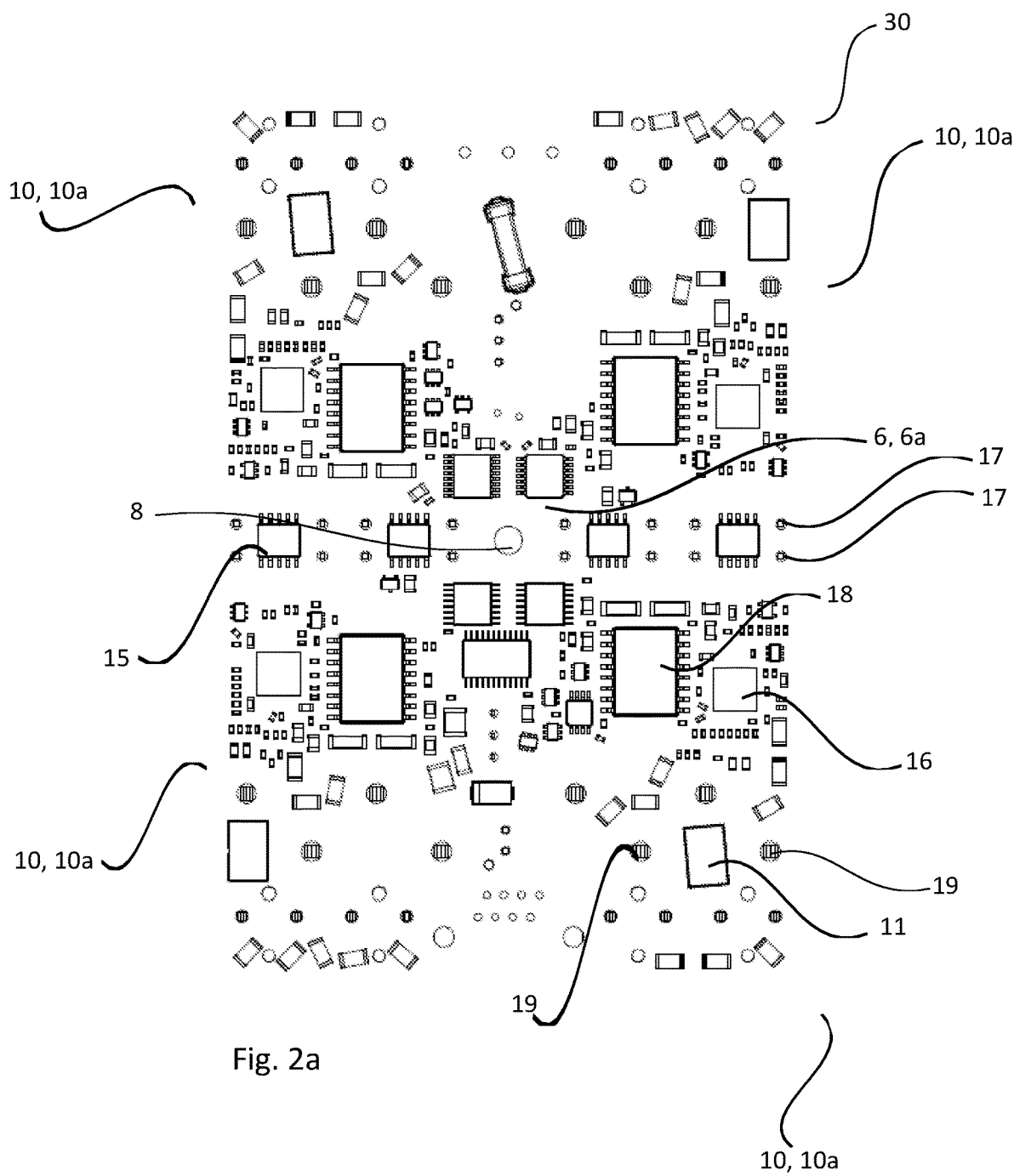
FIG. 2*a* shows a printed circuit board with a first and second regions of a contactor module in accordance with one embodiment of the present invention.

FIG. 2*a* shows a printed circuit board 30 with a first 6 and second 10 regions of a contactor module 2 in accordance with one embodiment of the present invention. In the following, relevant components mounted on the printed circuit board 30 will be discussed in greater detail.

Accordingly, it is shown a first, optionally grounded region 6, also called cold region, associated with a first section 6*a* of the printed circuit board 30. The first region 6 comprises control circuitry 8, for instance power, communication and relay control electronics, mounted on said first section 6*a* of the printed circuit board 30. It is further shown four second regions 10, each associated with a second section 10*a* of the printed circuit board 30. The second regions 10 are galvanically isolated from said first region 6 and from each other. As easily seen, each second region 10, also called hot region, is associated with and positioned at a peripheral portion of the printed circuit board 30 whereas the first region 6 is associated with and positioned at a central portion of the printed circuit board 30.

Each second region 10 comprises the operating contact side of a 2-pole contactor (shown and discussed in connection with FIG. 3) mounted on said second section 10*a* of the printed circuit board 30. The operation principle of the 2-pole contactor is described in the Background of the Invention-section of the application. In this context, the contactor comprises two power relays. These are not visible in FIG. 2*a*, but pins 17 for these relay coils may be seen. Each pair of relay coils of the contactor requires a relay driver 15.

Each second region 10 is connected to a phase or a neutral wire of a thereto associated power outlet, discussed in connection with FIG. 1. The working voltage between a first 6 and a second region 10 or between two second regions 10 is in the range 100-415 V AC RMS. In this way second regions 10 can be connected to separate phases of a three-phase TN-S electrical supply system, and the first region 6 can be connected to protective earth.

The printed circuit board 30 consists of four layers, preferably made in copper, each having a thickness in the range 70-105 µm. High-current tracks connecting relays' operating contact terminals to onboard connectors for power outlet wires use all copper layers in parallel, which allows a continuous 16 A current to flow across the printed circuit board 30.

For billing purposes, an energy meter 16 is associated with said 2-pole contactor and mounted on said second section 10*a* of the printed circuit board 30. The energy meter 16 measures the amount of energy consumed by the hooked-up vehicle. A shunt resistor 11 is used for current measurement which allows for a compact design of the energy meter 16. In the vicinity of the shunt resistor 11, pins 19 for relays' operating contact terminals are shown.

Energy for powering said energy meter 16 is supplied by an isolated power converter being part of a corresponding digital isolator 18. In addition, each digital isolator 18 provides communication signals to the corresponding energy meter 16. Said digital isolator 18 is mounted across the isolation barrier between the first section 6*a* and the second section 10*a* of the printed circuit board 30. Its overall purpose is to transfer signals and power between the first 6 and the second regions 10.

Use of a multi-channel digital isolator with power transfer function instead of traditional optocouplers/optoisolators and an isolated power converter significantly reduces the overall size. Hereby, a compact solution is obtained.

As a further benefit, a dedicated programmable logic controller or a relay module is not required because contactor coils are energized by the circuit inside the contactor module. External energy meters are not required because metering is implemented in the contactor module.

As explained above, a limited volume is typically available in the interior of the conventional power post. Hence, the proposed, size-reduced contactor solution with minimum wiring is particularly suitable for retrofitting existing power posts when adding or upgrading control and/or metering functionality.

In addition, a hardware logic design without microcontrollers in the contactor module saves space by not requiring a programming interface. This also simplifies manufacturing and usage of the product.

Still with reference to FIG. 2*a*, clearance and creepage distances required to maintain electrical isolation between conducting parts of the printed circuit board 30 are in accordance with established industry standards, such as IEC 60950-1, and are well-known to the person skilled in the art.

Figure 2B:
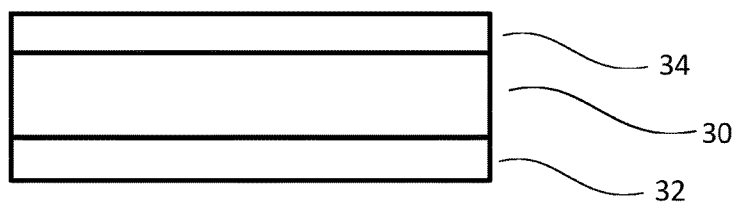
FIG. 2*b* schematically shows a printed circuit board sandwiched between two grounded or electrically floating electromagnetic shield layers.

As schematically shown in not-to-scale FIG. 2*b*, the printed circuit board 30 is sandwiched between two optionally grounded electromagnetic shield layers 32, 34 made in a conducting material, possibly on a non-conductive substrate. The conducting material of the two layers 32, 34 is normally a metal, preferably copper (Cu) or aluminium (Al). The layers 32, 34 are thin, their thickness, together with a non-conductive substrate, is inferior to 1.6 mm. In a preferred embodiment, the thickness of the respective layer is 0.8 mm. Non-desirable electromagnetic waves created by the digital isolator in operation are at least attenuated by sandwiching the entire printed circuit board 30 between two thin, optionally grounded layers 32, 34 made in a conducting material. Hereby, a compact solution is obtained.

Figure 3:
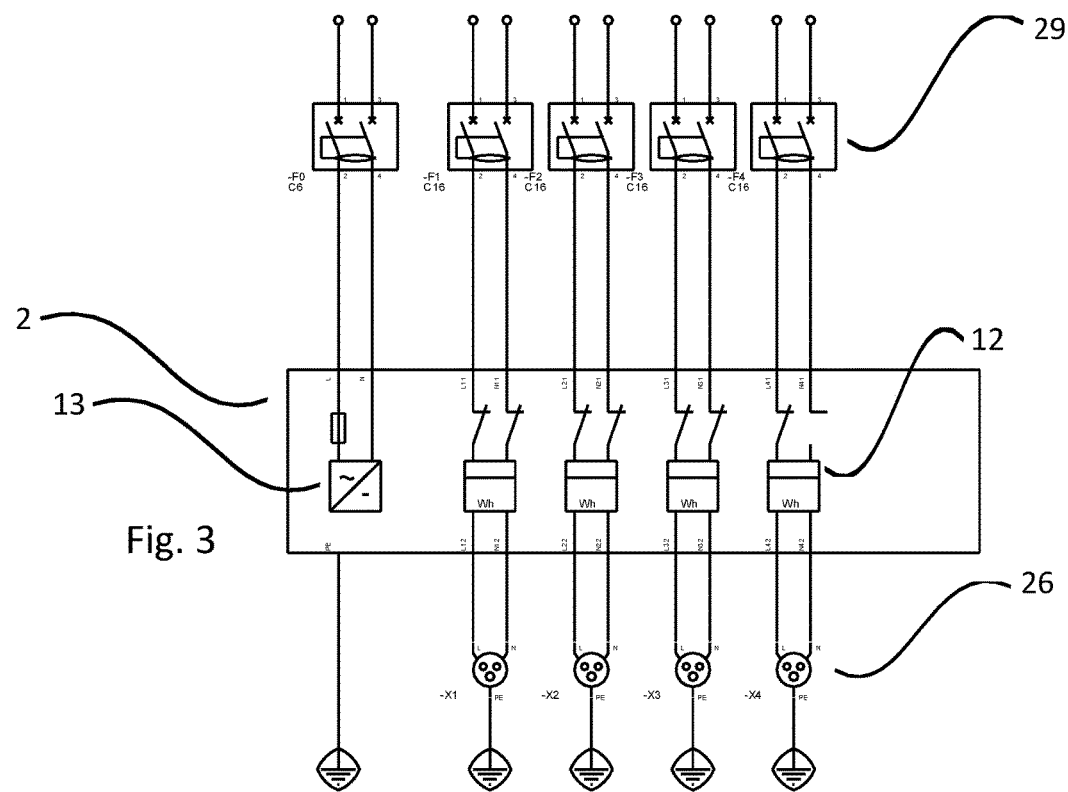
FIG. 3 is a wiring diagram of a power post equipped with a contactor module in accordance with one embodiment of the present invention.

FIG. 3 is a wiring diagram of a power post equipped with a contactor module 2 in accordance with one embodiment of the present invention. The contactor module 2 has four 2-pole contactors 12. In FIG. 3, it is also schematically shown that each of these contactors 12 is connected to a corresponding power outlet 26. Circuit breakers 29 and a power converter (AC-DC) 13 are also visualised.

Figure 4A:
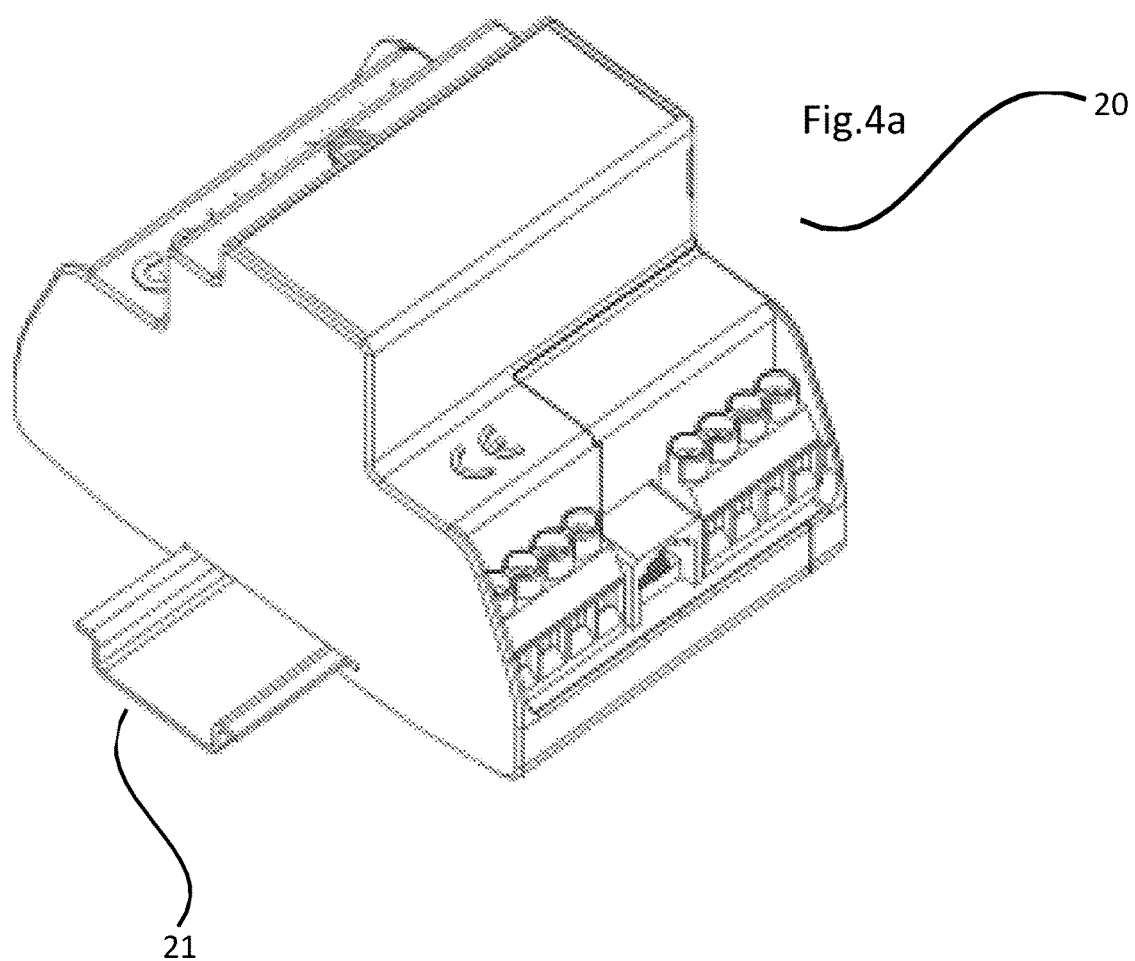
FIG. 4*a* is a perspective view of an enclosure when mounted on a 35-mm DIN-rail.

FIG. 4*a* is a perspective view of an enclosure 20 when mounted on a traditional 35-mm DIN-rail 21. As is known in the art, a DIN-rail 21 is a standardized metal rack used for mounting industrial control equipment. Said enclosure 20 fully encloses the remaining components of the contactor module. The enclosure 20 is made in a tough and rigid polymer material, by way of example polyethylene terephthalate glycol (PETG) or acrylonitrile-butadiene-styrene (ABS).

Figure 4B:
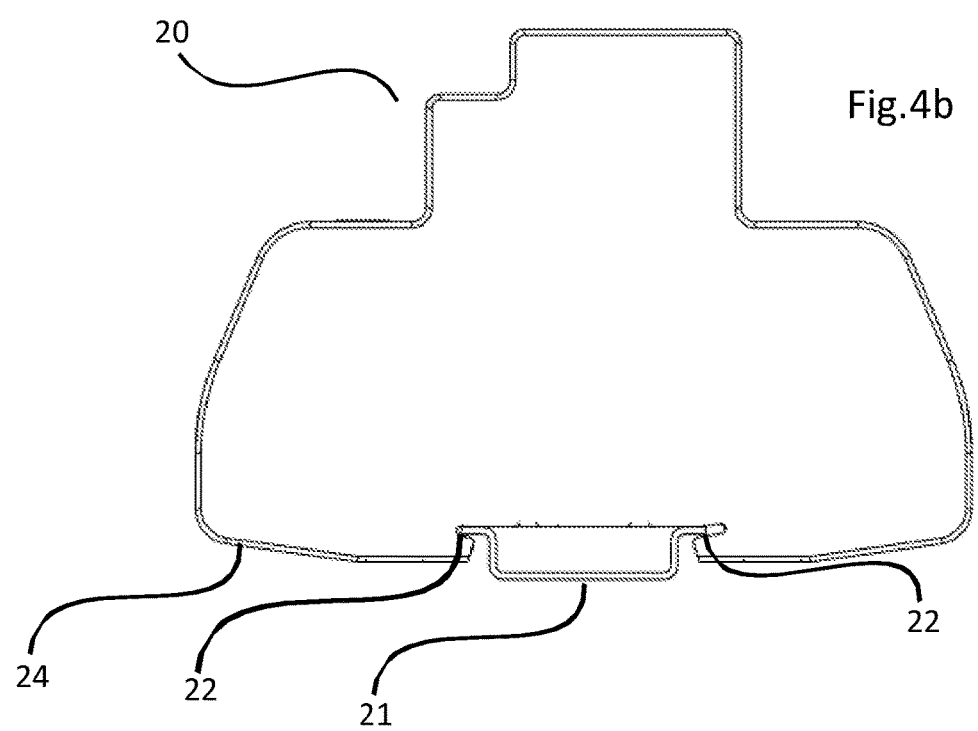
FIG. 4*b* is a cross-sectional top view showing inter alia a back side of the enclosure of FIG. 4*a*.

FIG. 4*b* is a cross-sectional top view showing inter alia a back side 24 of the enclosure 20 of FIG. 4*a*. A pair of suitably shaped and sized, superficially extending grooves 22 for engaging with said 35-mm DIN-rail 21 is provided in an upper respectively lower part of the back side 24 of the enclosure 20. The grooves 22 face one another. Accordingly, the enclosure 20 may be laterally slided into firm engagement with the DIN-rail 21. Hence, placing the enclosure 20 in the interior of the power post may be performed in a simple manner.

In another embodiment (not shown), compression springs are provided in a lower part of a back side of the enclosure. A single, superficially extending groove for engaging with said 35-mm DIN-rail is provided in an upper part of the back side of the enclosure. The enclosure is mounted onto the DIN-rail by said single groove simply engaging from above with an edge of the DIN-rail.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A contactor module for installation in a power post, said contactor module comprising:
   a first region associated with a first section of a printed circuit board and comprising communication and control circuitry mounted on said first section of the printed circuit board, wherein a power converter provides power to the contactor module,
   at least one second region associated with a second section of the printed circuit board, the at least one second region being galvanically isolated from said first region and each of the at least one second region comprising:
      a 2-pole contactor mounted on said second section of the printed circuit board,
      an energy meter associated with said 2-pole contactor and mounted on said second section of the printed circuit board,
   a digital isolator for transferring signals and/or power between the first regions and a respective one of the second regions, said digital isolator being mounted across an isolation barrier extending between said first section and said second section of the printed circuit board,
   said printed circuit board being sandwiched between two layers made of a conducting material, and
   an enclosure.

2. The contactor module in accordance with claim 1, wherein said enclosure is adapted for mounting onto a 35-mm DIN-rail.

3. The contactor module in accordance with claim 2, wherein at least one compression spring is provided in a lower part of a back side of the enclosure and a groove for engaging with said 35-mm DIN-rail is provided in an upper part of the back side of the enclosure.

4. The contactor module in accordance with claim 1, wherein at least one second region comprises four second regions, said second regions being galvanically isolated from each other.

5. The contactor module in accordance with claim 4, wherein each of the second regions is associated with a corresponding peripheral portion of the printed circuit board and said first region is associated with a central portion of the printed circuit board.

6. The contactor module in accordance with claim 4, wherein each of the second regions is connected to a phase and/or a neutral wire of an associated power outlet to the respective one of the second regions.

7. The contactor module in accordance with claim 4, wherein a working voltage between a first region and the respective one of the second regions or between two of the respective one of the second regions is in the range 100-415 V AC RMS.

8. The contactor module in accordance with claim 1, wherein said digital isolator supplies power to said energy meter.

9. The contactor module in accordance with claim 1, wherein the conducting material of two layers is copper (Cu) or aluminum (Al), and the two layers are either grounded or electrically floating.

10. The contactor module in accordance with claim 1, wherein each of the two layers made in the conducting material has a thickness inferior to 1.0 mm.

11. The contactor module in accordance with claim 1, wherein the first region is grounded.

\* \* \* \* \*